United States Patent [19]
Abe et al.

[11] Patent Number: 5,240,883
[45] Date of Patent: Aug. 31, 1993

[54] METHOD OF FABRICATING SOI SUBSTRATE WITH UNIFORM THIN SILICON FILM

[75] Inventors: Takao Abe, Annaka; Masatake Katayama, Takasaki; Akio Kanai, Annaka; Konomu Ohki, Annaka; Masatake Nakano, Annaka, all of Japan

[73] Assignee: Shin-Etsu Handotai Co., Ltd., Tokyo, Japan

[21] Appl. No.: 841,166

[22] Filed: Feb. 25, 1992

[30] Foreign Application Priority Data

Dec. 27, 1991 [JP] Japan .................................. 3-358935

[51] Int. Cl.⁵ ........................................... H01L 21/465
[52] U.S. Cl. ...................................... 437/228; 437/62; 437/974; 148/DIG. 135; 148/DIG. 127
[58] Field of Search ................. 437/62, 228, 974, 966; 148/DIG. 135, DIG. 127

[56] References Cited

U.S. PATENT DOCUMENTS 4,601,779 7/1986 Abernathy et al. ................. 437/974
4,649,627 3/1987 Abernathy et al. ...... 148/DIG. 135
4,983,251 1/1991 Haisma et al. ......................... 437/62
5,013,681 5/1991 Godbey et al. ....................... 437/62

Primary Examiner—Brian E. Hearn
Assistant Examiner—Trung Dang
Attorney, Agent, or Firm—Nikaido, Marmelstein, Murray & Oram

[57] ABSTRACT

A thin Silicon film On Insulator (SOI) material fabricating method which is capable of providing a very high thickness uniformity of the silicon film, a process simplification and a considerable reduction of processing cost is disclosed, in which a silicon oxide film is formed on one or both of a p-type silicon bond wafer and a silicon base wafer, then the two wafers are bonded together through the silicon oxide film, subsequently a fixed positive charge is induced in the silicon oxide film to form a n-type inversion layer in the p-type silicon bond wafer adjacent to an interface between the p-type silicon bond wafer and the silicon oxide film layer, and thereafter a chemical etching is effected while applying a positive voltage to the p-type silicon bond wafer so that an etch-stop is made at an interface between a depletion layer including the n-type inversion layer and the p-type layer.

11 Claims, No Drawings

METHOD OF FABRICATING SOI SUBSTRATE WITH UNIFORM THIN SILICON FILM

BACKGROUND OF THE INVENTION

1. Field of the Invention

The present invention relates to a method of fabricating a bonded Silicon On Insulator (SOI) substrate having a highly uniform thin film.

2. Description of the Prior Art

The bonded Silicon On Insulator (SOI) technique using single crystal silicon wafers is known as a method of fabricating semiconductor thin films of high crystal quality, the back side of which is inseparably covered by a silicon oxide film as an insulator.

According to a known method employing the bonded SOI technique, a single crystal silicon wafer which is later thinned (hereinafter referred to as a bond wafer) and a single crystal or polycrystal silicon wafer which has a role as a backing (hereinafter referred to as a base wafer) are used, and at least one of these silicon wafers is oxidized to form an oxide film on a surface of the silicon wafer. The bond and base wafers are superposed one above another with the silicon oxide film disposed therebetween as forming an intermediate layer, and after that these wafers are bonded together while heating them at a predetermined temperature. Then, the silicon bond wafer is thinned into a thin film, thus fabricating a bonded SOI structure.

Since the resultant single crystal silicon thin film (SOI layer) is obtained by thinning the single crystal silicon bond wafer into a thin film, the crystal quality of the silicon film does not change from that of the original single crystal silicon bond wafer and hence is quite satisfactory for a start of electronic device fabrication.

Various thinning techniques for the single crystal silicon bond wafer are known as summarized below.

(1) A high-doped n+ or p+ silicon bond wafer with a thin light doped n− or p− epitaxial layer is oxidized and then bonded with a silicon base wafer, the surface of the epitaxial layer facing to that of the base wafer. Subsequently, a selective etching process is performed to etch away the n+ or p+ silicon bond substrate while leaving the n− or p− epitaxial layer as bonded to fabricate a SOI structure.

(2) A silicon bond wafer is thinned by grinding off with an ultra high precision surface grinding machine.

(3) A silicon bond wafer with a grown-in oxide film is bonded with a silicon base wafer, and then the bond wafer is subjected to a polishing process in which the oxide film is used as a polish stopper to obtain a SOI structure.

These known thinning techniques, however, have various drawbacks as described below.

The first-mentioned thinning technique requires an epitaxial growth process and hence is costly to perform. In addition, due to difficulties in obtaining an epitaxially grows thin film with a sharp impurity concentration profile, the thickness uniformly of the thin film left is difficult to obtain (see IEDM 85, pp. 684–687, J. B. Lasky et al.).

The second-mentioned thinning technique is difficult to provide the required thickness uniformity of the thin film and also costly to perform because it requires an auxiliary means such as the selective etching.

The last-mentioned thinning technique requires complicated process, is hardly generalized due to limitations resulting from adjustment of the structural dimensions of the grown-in oxide film and frequently tends to provide an insufficient bond (see 47the Annual Device Research Conf., IEEE, VB-1 1989).

Due to its precision insufficiency, neither thinning technique stated above has succeeded in fabricating a thin SOI film of a high thickness uniformity such as about ±0.01 μm.

In short, the bonded SOI structure has the great advantage of perfect crystal quality. However, the conventional SOI fabrication techniques are unable to provide the desired thickness uniformity of the thin film, require complicated processes and costly to perform.

SUMMARY OF THE INVENTION

With the foregoing drawbacks of the prior art in view, it is an object of this invention to provide a method which is capable of fabricating a thin film SOI substrate having a desired thickness uniformity of film through a simple process and at a low processing cost.

According to a first aspect of this invention, there is provided a method of fabricating a thin film silicon on insulator wafer, comprising the steps of: providing a p-type silicon bond wafer and a silicon base wafer; forming a silicon oxide film layer on at least one of the p-type silicon bond wafer and the silicon base wafer; bonding the p-type silicon bond wafer and the silicon base wafer through the oxide film layer to form a composite wafer structure: inducing a fixed positive charge in the oxide film layer to form a n-type inversion layer in the p-type silicon bond wafer adjacent to an interface between the p-type silicon bond wafer and the oxide film layer; and thereafter, performing a chemical etching of a composite wafer structure while applying a positive voltage to the p-type silicon bond wafer so that an etch-stop is made at an interface between a depletion layer including the n-type inversion layer and the p-type layer.

According to a second aspect of the present invention, there is provided a method of fabricating a thin film silicon on insulator wafer, comprising the steps of: providing a p-type silicon bond wafer and a silicon base wafer; forming, on at least one of the p-type silicon bond wafer and the silicon base wafer, an oxide film having a large amount of fixed positive charge; bonding the p-type silicon bond wafer and the silicon base wafer through the oxide film while heating the superimposed wafer at a temperature ranging from 200° to 900° C., thereby forming a composite wafer structure; and thereafter, performing a chemical etching of said composite wafer structure while applying a positive voltage to the p-type silicon bond wafer so that an etch stop is made at an interface between a depletion layer including the n-type inversion layer and the p-type layer.

The above and other objects, features and advantages of the present invention will become more apparent to one skilled in the art from a reading of the following disclosure and the appended claims.

DETAILED DESCRIPTION OF THE INVENTION

To implement a thin film SOI substrate fabrication method according to one first aspect of this invention, a p-type silicon bond wafer and a silicon base wafer are provided. Then, a silicon oxide film is formed on at least one of the p-type silicon bond wafer and the silicon base wafer, and after which the p-type silicon bond wafer and the silicon base wafer are bonded through the oxide film layer so as to form a composite wafer structure. Subsequently, a fixed positive charge is induced in the oxide film to form a n-type inversion layer in the p-type silicon bond wafer adjacent to an interface between the p-type silicon bond wafer and the oxide film. Thereafter, a chemical etching of a composite wafer structure is performed while applying a positive voltage to the p-type silicon bond wafer, so that an etch-stop is made at an interface between a depletion layer including the n-type inversion layer and the p-type layer.

The fixed positive charge may be induced by exposing the composite wafer structure to X-ray radiation.

The oxide film may be formed on either one or both of the silicon bond wafer and the silicon base wafer. However, the oxide film formed on the silicon bond wafer is preferable because, when the oxide film is formed on the silicon base wafer, the bonding interface is contaminated with boron and the resistivity of the silicon bond wafer is change.

The p-type silicon bond wafer must be a silicon single crystal wafer, while the silicon base wafer may be a single crystal wafer or a polycrystal wafer and also may be of the p-type or n-type wafer.

To implement a thin film SOI substrate fabrication method according to another aspect of this invention, a p-type silicon bond wafer and a silicon base wafer are provided and then on at least one of the p-type silicon bond wafer and the silicon base wafer, an oxide film having a large amount of fixed positive charge is formed. Subsequently, the p-type silicon bond wafer and the silicon base wafer are bonded through the oxide film while heating the wafers at a temperature ranging from 200° to 900° C., thus forming a composite wafer structure. Thereafter, a chemical etching of the composite wafer structure is performed while applying a positive voltage to the p-type silicon bond wafer, so that an etch-stop is made at an interface between a depletion layer including the n-type inversion layer and the p-type layer.

The oxide film having a large amount of fixed positive charge may be formed by oxidizing at least one of the silicon wafers at a temperature of about 1050° C. for about 4 hours in an $H_2/O_2$ atmosphere, and subsequently taken out the silicon wafer at about 800° C. in a dry $O_2$ atmosphere.

According to the invention, when a fixed positive charge is induced in thee oxide film of the bonded SOI substrate, an n-type inversion layer is formed in the layer of the bond wafer adjacent to the interface between the oxide film. The chemical etching process is stopped at an interface between a depletion layer including the n-type inversion layer and the p-type layer with the result that the chemically thinned layer having a very high thickness uniformity can be obtained.

The fixed positive charge can easily be induced in the oxide film either by (1) exposing the SOI substrate to X-ray radiation, or by (2) taking out just after thermal oxidation into a dry $O_2$ atmosphere kept at a temperature near and less than about 900° C., then bonding the silicon bond wafer and silicon base wafer through the oxide film while heating the superimposed wafers at a temperature from 200° to 900° C.

The X-ray radiation creates a defect in Si-O covalent bond and produces electron-and-positive hole pairs in $SiO_2$. In $SiO_2$, the mobility of the positive holes is small and hence the positive holes are trapped in $SiO_2$. The amount of positive charge is thus increased by the X-ray radiation.

On the other hand, the heat treatment at 200°-900° C. during the bonding process is effective to prevent reduction of a fixed positive charge in the oxide film and hence is able to form an n-type inversion layer in the adjacent layer of the bond wafer. The bond and base wafers are bonded into an SOI substrate at a temperature above 200° C. Such a bonding is generally performed at 1100° C. in view of the bond strength, however, by the heat treatment at 1100° C., the amount of fixed positive charge initially present in $SiO_2$ is reduced and hence the formation of the n-type inversion layer is not possible.

By performing the chemical etching while applying a positive voltage to the p-type silicon bond wafer, an etch-stop occurs at the interface between a depletion layer including the n-type inversion layer and the p-type layer with the result that a thin silicon film is fabricated. When the chemical etching is performed without application of positive voltage, the etch-stop does not take place and, therefore, a thin silicon film cannot be fabricated.

Etchants which can be used in the chemical etching are known in the state of the art. The preferable etchant is KOH, for example. The applied positive voltage may be 0.3-5 V, and preferably about 1.2 V.

Those areas other than the surface of the bond wafer to be etched are covered or masked with a protective film to avoid etching. The protective film may be an $SiO_2$ film which is formed by the heat treatment performed in an oxidation atmosphere during the bonding process. Alternatively, when the $SiO_2$ film is insufficient, an additional protective film may be formed by using a silicone resin, for example.

The thickness of the thinned silicon film, which formed by the etch-stop at the interface between the depletion layer including the n-type inversion layer and the p-type layer, is substantially equal to the depth of the depletion layer. As the specific resistivity of the p-type silicon wafer used increases, the thickness of the controllably thinned film increases. It is, therefore, possible to adjust the thickness of the thinned silicon film.

According to the invention, it is further possible to annihilate the charge in $SiO_2$ film by a heat treatment, X-ray radiation, or lattice deformation. In the case where positive charge in the oxide film is increased by the X-ray radiation, the thus increased positive charge can be annihilated by a heat treatment performed at 1000° C. after etching. Alternatively, when the bonding of the two wafers is performed while maintaining the heat treatment temperature in the range of 200°-900° C. so as to prevent reduction of fixed positive charge, the positive charge can be reduced by a heat treatment performed at a temperature above 1000° C. after etching.

The invention will now be described by way of the following examples which should be construed as illustrative rather than restrictive.

EXAMPLE 1

Fabrication of SOI Substrate

A silicon bond wafer and a silicon base wafer were prepared using 20Ω-cm, 525 μm thick p-type (100) silicon wafers. The silicon bond wafer was oxidized at 1050° C. for 4 hours in an $H_2/O_2$ atmosphere and then taken out at 800° C. in a dry $O_2$ atmosphere. An oxide film ($SiO_2$) having a large amount of fixed positive charge was thus formed. Subsequently, the silicon bond wafer and the base wafer were placed in face to face contact with each other, with the oxide film layer disposed therebetween as forming an interface layer, and while keeping this condition, the silicon wafers were bonded together by heating them at 1100° C. for 2 hours in an $H_2/O_2$ atmosphere. Thereafter, the silicon bond wafer was ground, lapped and polished until a final substrate thickness of 5 $\mu$m was reached.

X-ray Radiation

The SOI substrate thus fabricated was exposed to approximately 1 MRAD X-ray radiation for 1 hour using an X-ray irradiating apparatus (manufactured and distributed by Rigaku Corporation) working at 50 kV, 1 A. With this irradiation of X-rays, an n-type inversion layer was formed in the layer of the silicon bond wafer adjacent to the interface between the oxide film and the bond wafer. The presence of the n-type inversion layer was confirmed by thee measurement of spreading resistance (SR).

Chemical Etching

Etchant: 30% KOH, 70° C.
Anode: an aluminum electrode vaccum-evaporated on the bond wafer and covered with an alkaline resistant protective film
Cathode: planar platinum (Pt)
Applied Voltage: 1.2 V An etching process effected on the SOI substrate having the n-type inversion layer under the conditions specified above was stopped after the lapse of 8 minutes, and an about 1.1 $\mu$m thick silicon film was obtained. Thickness uniformity of the thinned silicon film was measured by means of an optical film thickness measuring instrument (trade name "NANOSPEC" manufactured by Nanometrix Corporation). The measured thickness uniformity was in the range of $\pm 0.01$ $\mu$m and this indicated that the thinned silicon film of this invention had a very high thickness uniformity. Those areas other than the bond wafer to be etched were protected against etching because they were covered with an approximately 1 $\mu$m thick oxide film formed by the heat treatment during the bonding of the two silicon substrates.

Annihilation of Positive Charge

After the etching process described above, the SOI substrate was heat-treated at 1000° C. to annihilate the positive charges trapped in the oxide film.

EXAMPLE 2

Fabrication of SOI Substrate

Like the preceding Example 1, a pair of 20$\Omega$·cm, 525 $\mu$m thick p-type (100) silicon wafers was used to prepare a silicon bond wafer and a silicon base wafer. The silicon bond wafer was oxidized at 1050° C. for 4 hours in an $H_2/O_2$ atmosphere and then taken out at 800° C. in a dry $O_2$ atmosphere. A silicon oxide film ($SiO_2$) having a large amount of fixed positive charge was thus formed. Subsequently, the silicon bond wafer and the base wafer were placed in face to face contact with each other, with the oxide film disposed therebetween as forming an interface layer, and while keeping this condition, the silicon substrates were bonded together by heating them at 800° C. for 2 hours in an $H_2/O_2$ atmosphere. With this low temperature heat treatment, an n-type inversion layer was formed in the layer of the silicon bond wafer adjacent to the interface between the oxide film and the bond wafer. The presence of the n-type inversion layer was confirmed by the measurement of spreading resistance (SR). Thereafter, the silicon bond wafer were ground, lapped and polished until a final wafer thickness of 5 $\mu$m was reached.

Chemical Etching

Etchant: 30% KOH, 70° C.
Anode: an aluminum electrode vaccum-evaporated on the bond wafer and covered with an alkali resistant protective film
Cathode: planar platinum (Pt)
Applied Voltage: 1.2 V An etching process was effected on the bond wafer having the n-type inversion layer under the conditions specified above, and after the lapse of 8 minutes the etching was stopped and an about 1.1 $\mu$m thick silicon film was obtained. Thickness uniformity of the silicon film was measured by means of the optical film thickness measuring instrument (trade name "NANOSPEC" manufactured by Nanometrix Corporation). The measured thickness uniformity was in the range of $\pm 0.01$ $\mu$m and this indicated that the silicon film of this invention had a very high thickness uniformity. Those areas other than the silicon film to be etched were covered with a silicon oxide film formed by the heat treatment during the bonding of the two silicon wafers. However, the thickness of the oxide film was insufficient to prevent the unnecessary etching. To this end, an alkaline resistant film made from silicone resin was formed on the above-mentioned areas to protect them against etching.

Reduction of Positive Charge

After the etching process was performed, the SOI wafer was heat-treated at 1100° C. to reduce the positive charges trapped in the oxide film.

As described above, the method of this invention is able to fabricate a bonded SOI structure having a very high thickness uniformity while maintaining the advantage of perfect crystal quality, and contributive to process simplification and considerable reduction of processing cost.

What is claimed is:

1. A method of fabricating a thin silicon film on insulator material, comprising the steps of:

providing a p-type silicon bond wafer and a silicon base wafer;

forming a silicon oxide film on at least one of said p-type silicon bond wafer and said silicon base wafer;

bonding said p-type silicon bond wafer and said silicon base wafer through said silicon oxide film to form a composite wafer structure;

inducing a fixed positive charge in said silicon oxide film to form a n-type inversion layer in said p-type silicon bond wafer adjacent to an interface between said p-type silicon bond wafer and said silicon oxide film; and thereafter, performing a chemical etching of a composite wafer structure while applying a positive voltage to said p-type silicon bond wafer so that an etch-stop is made at an interface between a depletion layer including said n-type inversion layer and said p-type layer.

2. A method according to claim 1, wherein said fixed positive charge is induced by exposing said composite wafer structure to X-ray radiation.

3. A method according to claim 1, wherein said silicon oxide film is formed on said p-type silicon bond wafer.

4. A method according to claim 1, wherein said silicon oxide film is formed by heat-treating at least one of said silicon wafer at about 1050° C. for 4 hours in an $H_2/O_2$ atmosphere and then taken out at about 800° C. in a dry $O_2$ atmosphere.

5. A method according to claim 1, wherein said positive voltage applied to said p-type silicon bond wafer is in the range of from 0.3 to 5 V, and preferably about 1.2 V.

6. A method according to claim 1, further including heat-treating said composite wafer structure at a temperature above 1000° C. after said chemical etching is effected, thereby annihilating said fixed positive charge.

7. A method of fabricating a thin silicon film on insulator material, comprising the steps of:
   providing a p-type silicon bond wafer and a silicon base wafer;
   forming, on at least one of said p-type silicon bond wafer and said silicon base wafer, a silicon oxide film having a large amount of fixed positive charge;
   bonding said p-type silicon bond wafer and said silicon base wafer through said silicon oxide film while heating said wafers at a temperature ranging from 200° to 900° C., thereby forming a composite wafer structure; and
   thereafter, performing a chemical etching of said composite wafer structure while applying a positive voltage to said p-type silicon bond wafer so that an etch-stop is made at an interface between a depletion layer including said n-type inversion layer and said p-type layer.

8. A method according to claim 7, wherein said silicon oxide film is formed on said p-type silicon bond wafer.

9. A method according to claim 7, wherein said silicon oxide film is formed by heat-treating at least one of said silicon wafers at about 1050° C. for 4 hours in an $H_2/O_2$ atmosphere and then taken out at about 800° C. in a dry $O_2$ atmosphere.

10. A method according to claim 7, wherein said positive voltage applied to said p-type silicon bond wafer is in the range of from 0.3 to 5 V, and preferably about 1.2 V.

11. A method according to claim 1, further including heat-treating said composite wafer structure at a temperature above 1000° C. after said chemical etching is effected, thereby reducing the amount of said fixed positive charge.

* * * * *